United States Patent
Baba

Patent Number: 5,754,166
Date of Patent: May 19, 1998

[54] COORDINATE INPUT DEVICE

[75] Inventor: Ikuo Baba, Ibaragi-ken, Japan

[73] Assignee: Alps Electric Co., Ltd., Tokyo, Japan

[21] Appl. No.: 636,356

[22] Filed: Apr. 23, 1996

[30] Foreign Application Priority Data

Apr. 27, 1995 [JP] Japan ................................. 7-104074

[51] Int. Cl.$^6$ ................. G09G 5/08; G09G 5/00; H03K 17/94

[52] U.S. Cl. .................... 345/157; 345/160; 345/168; 341/22; 341/34

[58] Field of Search .................... 345/156–168; 341/34, 22; 338/99, 114, 128; 200/6 A

[56] References Cited

U.S. PATENT DOCUMENTS

| | | | |
|---|---|---|---|
| 4,680,577 | 7/1987 | Straayer et al. | 340/711 |
| 5,223,851 | 6/1993 | Hadden et al. | 343/873 |
| 5,296,447 | 3/1994 | Sato et al. | 503/227 |
| 5,367,282 | 11/1994 | Clem | 338/22 |
| 5,489,900 | 2/1996 | Cali et al. | 345/160 |
| 5,579,033 | 11/1996 | Rutledge et al. | 345/161 |

*Primary Examiner*—Steven Saras
*Assistant Examiner*—David L. Lewis
*Attorney, Agent, or Firm*—Guy W. Shoup

[57] ABSTRACT

A coordinate input device comprises a column-shaped body erected on a base, a plurality of sensors produced in a film form, a flexible cable for leading out sensor signals from the sensors, and a transparent heat-shrinkable tube. In this coordinate input device the sensors are affixed with a thermosetting resin on the side surfaces of the column-shaped body; and the tube is put on the sensors and then heated for shrinking, thereby pressing to affix the sensors on the side surfaces of the column-shaped body with the thermosetting resin and also covering the surfaces of the sensors. Then the cap is mounted on the top of the column-shaped body and the tube is fitted in a recess section inside the cap.

5 Claims, 5 Drawing Sheets

COORDINATE INPUT DEVICE

BACKGROUND OF THE INVENTION

1. Field of the Invention

The present invention relates to a coordinate input device as a pointing device for controlling a cursor position on a CRT display.

2. Description of the Related Art

Generally a graphic display device is equipped with such a pointing device as a mouse and track ball separately from a keyboard input device. In this case, however, there is such a disadvantage that a special space is needed for mounting the pointing device, resulting in an increased mounting space area for the whole body of the graphic display device.

There has been proposed in Japanese Utility Model Laid-Open No. Hei 4-120138 (1992) a coordinate input device as a pointing device incorporated in a keyboard input device with a multitude of keyswitches arranged thereon. The keyboard input device integrally incorporating the pointing device has such advantages as the capability of decreasing the mounting space and easy conveyance, showing an increasing tendency of a demand for the coordinate input device in a field where miniaturization of equipment is keenly demanded such as portable personal computers.

FIG. 5 is a sectional view of a prior art pointing device of this type; FIG. 6 is a front view of the pointing device of FIG. 5; and FIGS. 7A, 7B and 7C show explanatory views showing the manufacturing process of the pointing device of FIG. 5.

The pointing device of FIG. 5 comprises a column-shaped body 2 of a quadrangular pyramid form erected on a base 1, four sensors 3 produced in a film form and affixed on the side surfaces of the column-shaped body 2, a UV resin (ultraviolet-curing resin) 4 covering these sensors 3, a flexible cable 5 for leading a sensor signal out from the sensors 3, and a cap 6 produced of such a soft material as silicon rubber and attached on the top of the column-shaped body 2.

According to a prior art method, when the sensor 3 is affixed on the side surface of the column-shaped body 2, the following method is adopted. That is, as shown in FIG. 7A, with a thermosetting resin 7 such as an epoxy adhesive coated on the side surfaces of the column-shaped body 2, the film-like sensor 3 is attached via the thermosetting resin 7. Then, these sensors 3 are pressed by a jig 8 against the side surfaces of the column-shaped body 2. In this state, the sensors 3 are affixed on the side surfaces of the column-shaped body 2 by heating to set the thermosetting resin 7 for a period of one hour at about 110° C. Subsequently, after the release of the heating condition and, as shown in FIG. 7B, the removal of the jig 8 pressure, the UV resin 4 is coated on the surfaces of the sensors 3 and their periphery as shown in FIG. 7C, and then ultraviolet rays are applied to the UV resin 4 for 5 to 20 seconds to thereby set the UV resin 4, acquiring a protective coat for protection of the surfaces of the sensors 3 from static electricity.

In the aforesaid prior art pointing device, the jig 8 is needed for pressing the sensors 3 against the side surfaces of the column-shaped body 2. That is, an extra expense is needed for the manufacture of this jig 8. There is, therefore, such a problem as the necessity of a process for applying the UV resin 4 and irradiating ultraviolet rays thereto to obtain a protective coat for the sensors 3, thereby increasing the manufacturing cost. Furthermore, since the UV resin 4 is opaque, it was impossible to ascertain the presence of foreign substances on the sensors 3 or of such a defect as bends of the sensors 3 under the condition that the sensors 3 are coated with the UV resin 4.

Another problem of the prior art pointing device is that when the pointing device is in practical use, a cap 6 is attached on the top of the column-shaped body 2; however, the silicon rubber cap 6, when fitted on the UV resin 4, the surface of which is slippery, easily comes off the top of the column-shaped body 2. To prevent the cap 6 from falling, therefore, an unillustrated jig which is heated is used to press the top of the column-shaped body 2, to thereby form a projection 2a, which is engaged with the inner surface of the cap 6. Accordingly the jig for forming the projection 2a and a process for providing the projection 2a are needed. This will further increase the manufacturing cost.

SUMMARY OF THE INVENTION

In view of the above-described disadvantages inherent in the heretofore known technique, it is a first object of the present invention to provide a coordinate input device which can easily be assembled and manufactured at a low cost, and a method of manufacturing the same; it is a second object to provide a coordinate input device which can easily install a cap on the top of a column-shaped body; and it is a third object to provide a coordinate input device which ensures easy ascertaining of the affixed condition of sensors.

To accomplish the first object, the coordinate input device of the present invention comprises a column-shaped body erected on a base, a plurality of sensors affixed on the side surfaces of the column-shaped body, a heat-shrinkable tube covering these sensors, and a flexible cable for leading sensor signals from the sensors to the outside.

Also to accomplish the first object, the method for manufacturing the coordinate input device of the present invention comprises the steps of bonding, by a thermosetting resin, a plurality of sensors formed in a film form to the side surfaces of a column-shaped body erected on a base, covering a heat-shrinkable tube on the sensors, and then setting the thermosetting resin by heating and at the same time shrinking the heat-shrinkable tube, to cover the sensors with the shrinkable tube and to fit a cap on the top of the column-shaped body.

Furthermore, to accomplish the second object, the coordinate input device of the present invention is fitted with a cap mounted on the top of the column-shaped body; in a recess section formed inside of this cap is fitted the heat-shrinkable tube.

Furthermore, to accomplish the third object, the heat-shrinkable tube of the coordinate input device of the present invention is produced of a transparent material.

A plurality of sensors produced in a film form are affixed on the side surfaces of a column-shaped body erected on a base and a heat-shrinkable tube is covered on these sensors. Then, the tube is heated for shrinking to press the sensors to the side surfaces of the column-shaped body, thus covering the surfaces of the sensors. Since this method dispenses with the process of applying a UV resin and irradiating ultraviolet rays thereto to obtain a protective coat for the sensors previously stated, the coordinate input device of the present invention is easy to assemble. Also, since the shrinkage of the heat-shrinkable tube keeps the sensors firmly on the side surfaces of the column-shaped body, no jig is needed to press the sensors, thereby enabling to decrease the manufacturing cost.

Furthermore, in the coordinate input device of the present invention provided with a cap on the top of the column-shaped body, the heat-shrinkable tube is fitted in a recess section defined inside the cap and therefore the cap becomes hard to remove from the top of the column-shaped body. It is, therefore, unnecessary to adopt a machining process for providing a projection for preventing the cap from coming off the top of the column-shaped body. The cap can easily be mounted on the top of the column-shaped body.

Furthermore, in the coordinate input device of the present invention provided with the transparent heat-shrinkable tube, the sensor is visible from the outside through the tube. The affixed condition of the sensors can easily be checked after the sensors are covered with the tube.

DESCRIPTION OF THE PREFERRED EMBODIMENT

Hereinafter a preferred embodiment of the present invention will be explained with reference to the accompanying drawings.

Figure 1:
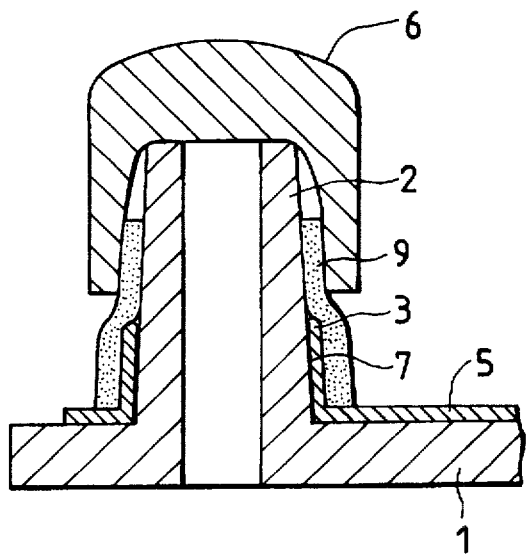
FIG. 1 is a sectional view of one embodiment of a pointing device according to the present invention.
Figure 2:
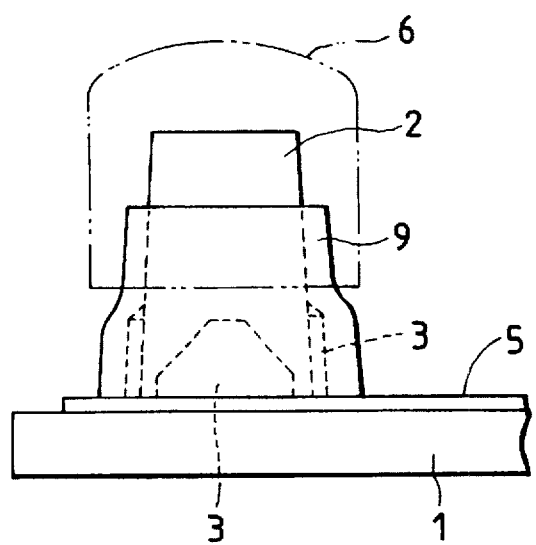
FIG. 2 is a front view of the pointing device of FIG. 1.
Figure 3A:
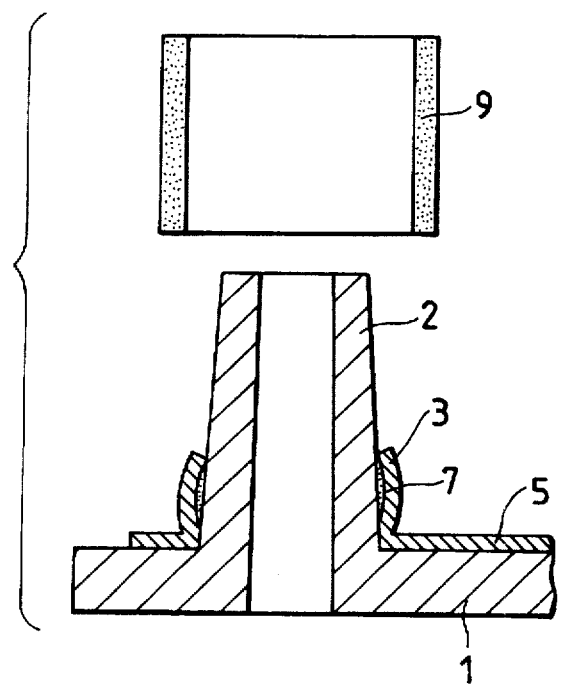
FIGS. 3A and 3B are process charts for affixing sensors on the side surfaces of a column-shaped body provided in the pointing device.
Figure 3B:
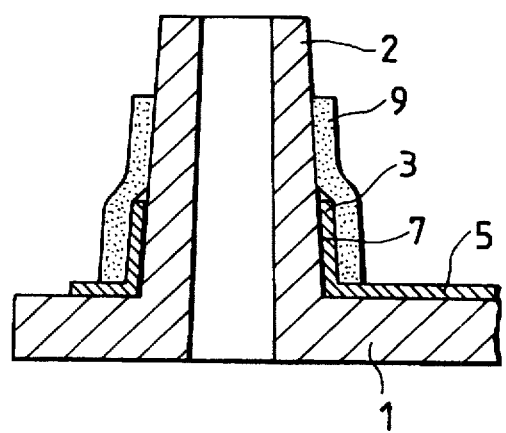
Figure 5:
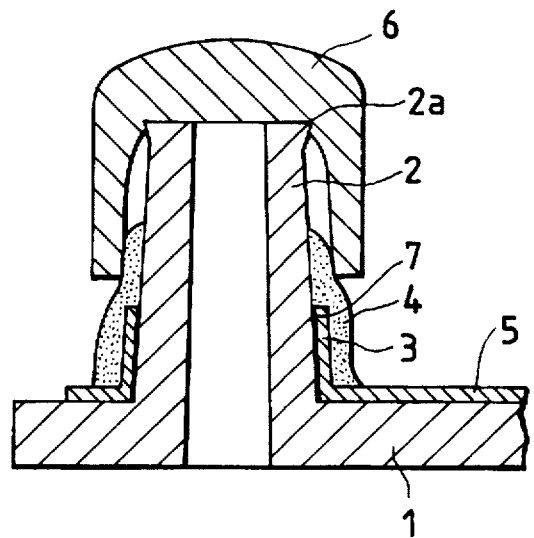
FIG. 5 is a sectional view of a prior art pointing device.
Figure 6:
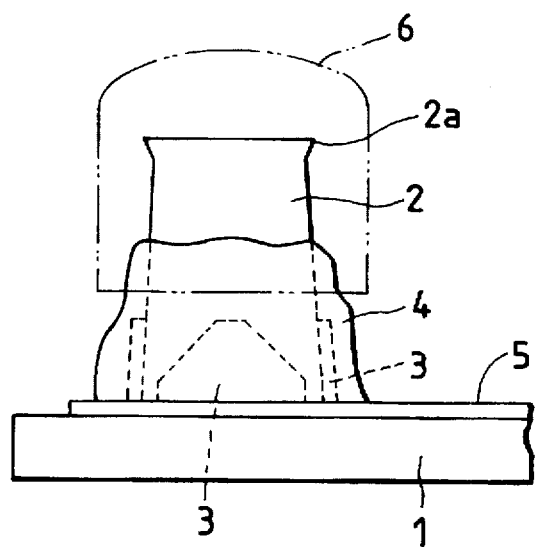
FIG. 6 is a front view of the pointing device of FIG. 5.
Figure 7A:
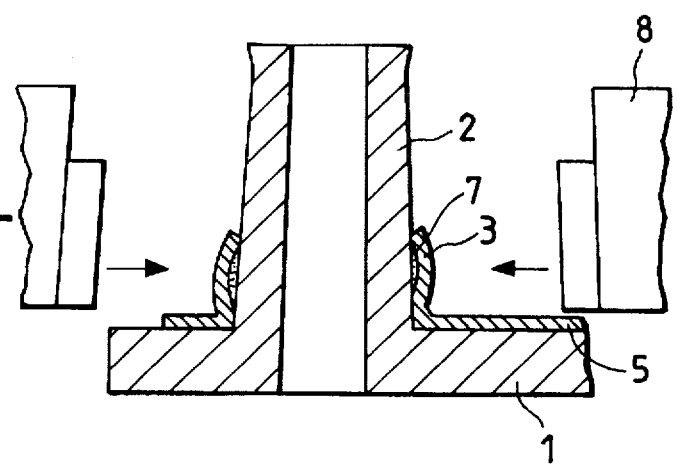
FIGS. 7A, 7B, and 7C are explanatory views showing the manufacturing process of the pointing device of FIG. 5.
Figure 7B:
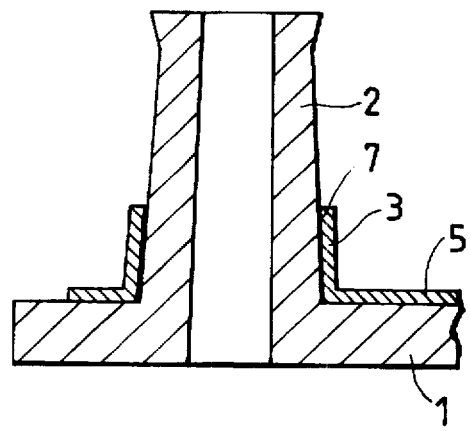
Figure 7C:
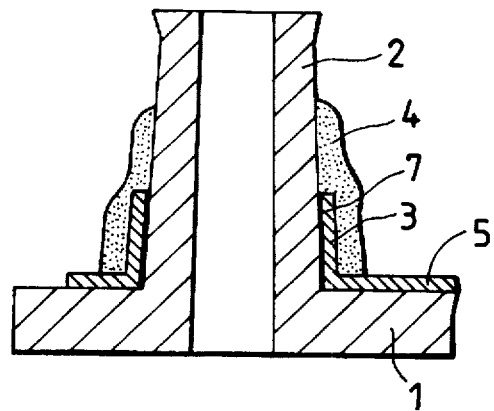

FIG. 1 is a sectional view of a pointing device pertaining to one embodiment of the present invention; FIG. 2 is a front view of the pointing device; FIGS. 3A and 3B show a process of affixing sensors to the side surfaces (peripheral surface) of a column-shaped body provided in the pointing device; and FIG. 4 is a perspective view showing the general constitution of the pointing device; in FIGS. 1 to 4, the same members as those in FIGS. 5 to 7 are designated by the same reference numerals.

As shown in FIGS. 1 to 4, the pointing device of the present embodiment comprises a column-shaped body 2 erected on a base 1, four sensors 3 produced in a film form and affixed on the side surfaces of the column-shaped body 2, a heat-shrinkable tube 9 for covering these sensors 3, a flexible cable 5 for leading sensor signals from these sensors 3 to the outside, and a cap 6 mounted on the top of the column-shaped body 2. That is, the pointing device of the present embodiment is basically the same in constitution excepting mainly the point that the heat-shrinkable tube 9 is provided in place of the UV resin 4 shown in FIGS. 5 to 7.

Figure 4:
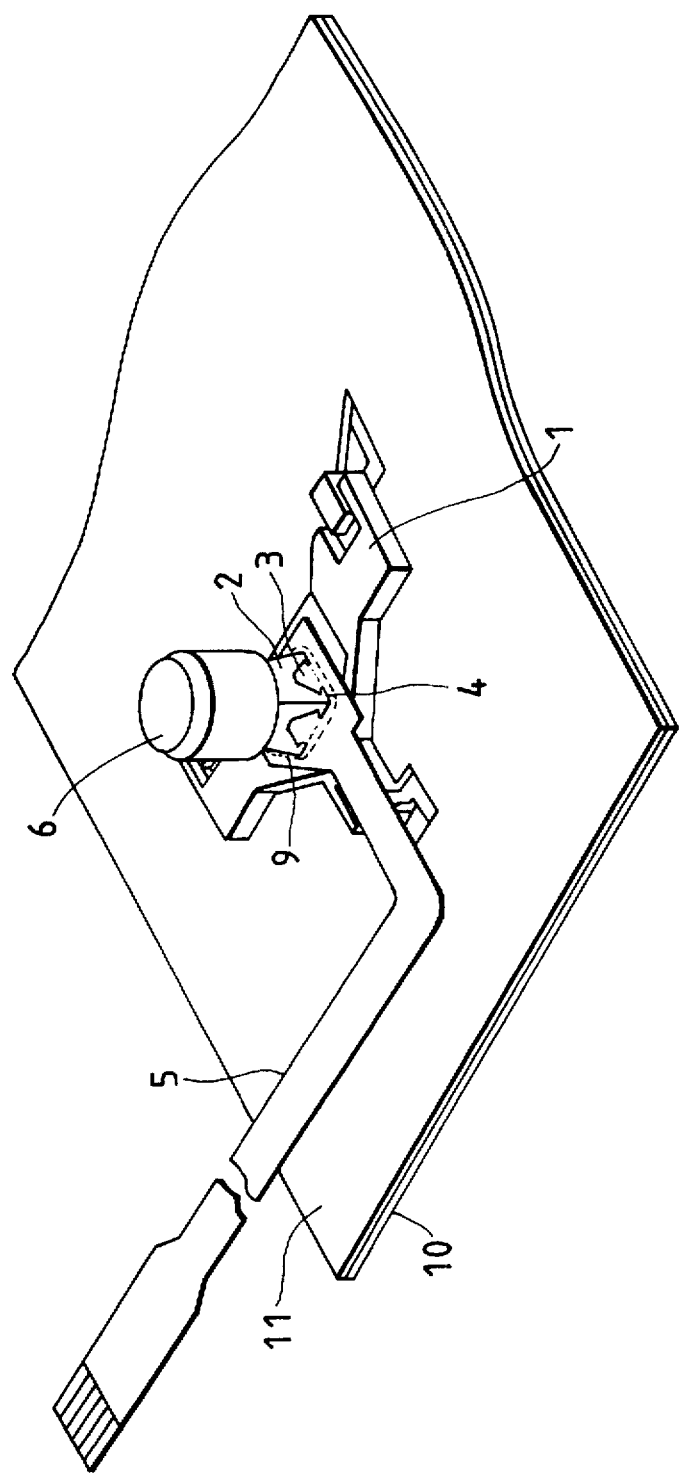
FIG. 4 is a perspective view showing the general constitution of the pointing device.

In the pointing device of the above-described constitution, as shown in FIG. 4, the base 1 is mounted on a metal plate 10 through a membrane sheet substrate 11. The metal plate 10 and the membrane sheet substrate 11 are arranged inside the keyboard input device. On the metal plate 10 and the membrane sheet substrate 11 are mounted a number of unillustrated keyswitches.

The sensors 3 and the flexible cable 5 are obtained by printing, on a common base film not illustrated, a resistor constituting a strain sensor and a wiring electrically connected with the resistor. The base film has in its one end the aforesaid resistor formed by printing and a cross slit to be inserted into the column-shaped body 2. The cross slit serves to divide the four sensors 3 into respective divisions. On the other part of the base film the wiring is formed by printing from one end side to the other end side.

When the sensors 3 are mounted on the column-shaped body 2, the one end of the base film is inserted as deep as the root of the column-shaped body 2 with the column-shaped body 2 aligned with the cross slit section at the one end of the base film. Thus the four sensors 3 are pushed upward as shown in FIG. 4. In this state each of the sensors 3 is affixed on each outside surface of the column-shaped body 2 through the thermosetting resin 7.

Also, the heat-shrinkable tube 9 is produced of a selected appropriate one of flexible polyvinylidene fluoride, polyolefine, PVC (polyvinyl chloride), etc. At normal temperatures, the inside diameter of the heat-shrinkable tube 9 is set slightly larger than the outside diameter of the column-shaped body 2; therefore at normal temperatures the column-shaped body 2 can easily be inserted into the heat-shrinkable tube 9.

Next, the method of manufacturing the coordinate input device of the present embodiment will be explained.

First, the side surfaces of the column-shaped body 2 is coated with the thermosetting resin 7 such as an epoxy adhesive, and the one end of the base film provided with the sensors 3 is inserted as deep as the root section of the column-shaped body 2; thus, the sensors 3 are pushed upward along the side surfaces of the column-shaped body 2 as shown in FIG. 3A. Subsequently, the heat-shrinkable tube 9, after being mounted on the sensors 3, is heated at about 110° C. for about one hour, thereby shrinking (undergoing thermal contraction) to cover the surfaces of the sensors 3 as shown in FIG. 3B and at the same time holding the sensors 3 pressed against the side surfaces of the column-shaped body 2. In this state, the thermosetting resin 7 is set to affix the sensors 3 to the side surfaces of the column-shaped body 2 through the thermosetting resin 7. Subsequently, after the heating condition is released for cooling, the cap 6 is mounted on the top of the column-shaped body 2 as shown in FIG. 1, and then the heat-shrinkable tube 9 is fit in the recess section defined inside of this cap 6.

According to the present embodiment of the aforesaid constitution, the process for applying a UV resin and irradiating ultraviolet rays thereto to obtain a protective coat for the protection of the sensors 3 is not needed, ensuring high assembling performance. Furthermore, since the heat-shrinkable tube 9 shrinks to thereby enable to cover the surfaces of the sensors 3 and to press the sensors 3 against the side surfaces of the column-shaped body 2, it is unnecessary to use a special jig for pressing the sensors 3 and the manufacturing cost can be decreased.

Furthermore, in the present embodiment described above, since the heat-shrinkable tube 9 is fitted in the recess section inside the cap 6 to prevent accidental removal of the cap 6 from the top of the column-shaped body 2, no process is required for providing a projection for preventing the accidental removal of the cap 6 from the top of the column-shaped body 2. The cap 6 can easily be mounted to the top of the column-shaped body 2.

Furthermore, in the present embodiment described above, since the heat-shrinkable tube 9 is transparent and the sensors 3 can be observed from the outside through the tube 9, it is possible to easily check the affixed condition of the sensors 3 after covering the sensors 3 with the tube 9.

Moreover, for example, in place of the resistor constituting the strain sensor and used as the sensors 3 affixed on the side surfaces of the column-shaped body 2, other types of sensors may be integrally formed on the base film; and furthermore a pressure-sensitive rubber may be used as the sensors. Also, the shape of the column-shaped body 2 is not limited to the quadrangular pyramid, and may be conical and each sensor may be attached on the peripheral surface thereof.

Having described the specific preferred embodiment of the invention with reference to the accompanying drawings, it will be appreciated that the present invention is not limited to the embodiment, and that various changes and modifications can be effected therein by one of ordinary skill in the art without departing from the scope and spirit of the invention as defined by the appended claims.

What is claimed is:

1. A coordinate input device comprising:

a column-shaped body erected on a base, said column shaped-body having a peripheral surface;

a plurality of sensors arranged on the peripheral surface of said column-shaped body;

a tube covering all of said plurality of sensors and surrounding a portion of said column-shaped body; and a flexible cable for transmitting sensor signals from said sensors, wherein said tube is formed from a heat-shrinkable material which biases said sensors against said column-shaped-body due to thermal contractions;

wherein thermosetting resin is disposed between the detecting sensor and the peripheral surface of the column-shaped body; and wherein said tube is shrunk by thermal contraction before the detecting sensor is adhered to the side surface through hardening of the thermosetting resin.

2. A coordinate input device according to claim 1, wherein a cap is provided to be mounted on the top of said column-shaped body; and said tube is fitted into a recess section inside said cap.

3. A coordinate input device according to claim 1, wherein said tube is transparent.

4. A coordinate input device according to claim 1, further comprising a base film upon which is formed said plurality of sensors and said flexible cable, wherein said plurality of sensors comprise resistors formed on the base film, and the flexible cable comprises wiring patterns printed on said base film and contacting said resistors; and wherein said base film is adhered to said column-shaped body with said thermosetting resin.

5. A coordinate input device according to claim 1, wherein said heat-shrinkable material forming said tube is selected from the group consisting of flexible polyvinylidene flouride, polyolefine and polyvinyl chloride.

* * * * *